United States Patent [19]
Van Hulett et al.

[11] Patent Number: 4,723,224
[45] Date of Patent: Feb. 2, 1988

[54] CONTENT ADDRESSABLE MEMORY HAVING FIELD MASKING

[75] Inventors: Terry Van Hulett, San Antonio; Jesse R. Wilson; Ralph McGarity, both of Austin, all of Tex.

[73] Assignee: Motorola, Inc., Schaumburg, Ill.

[21] Appl. No.: 815,610

[22] Filed: Jan. 2, 1986

[51] Int. Cl.[4] .............................................. G11C 15/00
[52] U.S. Cl. ...................................... 365/49; 365/154
[58] Field of Search .................. 365/49, 154, 230, 233

[56] References Cited
FOREIGN PATENT DOCUMENTS
3105503 9/1982 Fed. Rep. of Germany ........ 365/49

OTHER PUBLICATIONS
J. C. Hou, "CAM Cell for Use in Hybrid Memory Scheme", IBM Technical Disclosure Bulletin, vol. 26, No. 8, Jan. 1984, pp. 4331-4334.

Primary Examiner—Joseph A. Popek
Attorney, Agent, or Firm—John A. Fisher; Jeffrey Van Myers

[57] ABSTRACT

A content addressable memory (CAM) comprising a plurality of CAM cells, each including a static read/write memory (RWM) cell and an EXCLUSIVE OR (XOR) gate which couples a sense line to a ground line only if the logic state of the operand bit stored in the RWM cell does not match the logic state of an operand bit presented to the CAM cell. By arranging a selected subset of the CAM cells so that the XOR gates thereof act upon a first portion of either the sense line or the ground line while the balance of the CAM cells are arranged so that the XOR gates thereof act upon a second portion of that same line, a single coupler interposed between the first and second portions can be selectively disabled by a mask signal to simultaneously mask all of the bits stored in the subset of CAM cells during the matching operation of the CAM. If appropriate, the mask signal may comprise the bit stored in a particular one of the CAM cells.

7 Claims, 2 Drawing Figures

CONTENT ADDRESSABLE MEMORY HAVING FIELD MASKING

CROSS REFERENCE TO RELATED APPLICATIONS

Related subject matter is disclosed in the following copending applications, all of which are assigned to the same Assignee as the subject invention:

1. U.S. application Ser. No. 815,596 entitled PAGED MEMORY MANAGEMENT UNIT CAPABLE OF SELECTIVELY FLUSHING SHARED TRANSLATORS IN A TRANSLATION CACHE, invented by Michael W. Cruess, Ralph McGarity and William C. Moyer, filed Jan. 2, 1986; and 2. U.S. application Ser. No. 815,601 entitled CONTENT ADDRESSABLE MEMORY CELL, invented by Jesse Rudolph Wilson, Terry Van Hulett, and Michael Ren Kent, filed Jan. 2, 1986.

BACKGROUND OF THE INVENTION

In general, content addressable memory (CAM) cells are used in combination with a read/write memory (RWM) cell to form an associative memory for use in caches, memory management units, and the like. Examples of such memories are shown in U.S. Pat. Nos. 3,229,255, 3,235,845, 3,239,818, 4,296,475, 4,404,653, 4,473,878. Other examples are discussed in James T. Koo, *Integrated-Circuit Content-Addressable Memories*, IEEE Journal of Solid-State Circuits, vol. SC-5, No. 5, pp 208-215, October 1970; Hiroshi Kodata, et al., *An 8 Kb Content-Addressable and Reentrant Memory*, IEEE International Solid-State Circuits Conference 1985 Digest of Technical Papers, pp 42-43, February 1985 (which is also in IEEE Journal of Solid State Circuits, vol. SC-20, No. 5, pp 951-957). In some of these memories, the bits stored in certain subsets or "fields" of the CAM cells in each word are selectively masked in response to a mask signal of some suitable form. In general, significant additional circuitry is required in order to provide this masking function. In addition to increasing the size, complexity and power dissipation of the memory, the masking circuitry often required the CAM cells of the masked and masking bits to be significantly different, contributing to layout difficulties of the memory.

SUMMARY OF THE INVENTION

Accordingly, it is an object of the present invention to provide an improved content addressable memory (CAM) having field masking.

Another object is to provide a CAM which requires minimal circuitry to provide field maskability.

Yet another object of the present invention is to provide a field maskable CAM cell wherein all cells are identical in structure.

These and other objects of the present invention are achieved in a content addressable memory (CAM) including a plurality of CAM cells, each of which comprises a memory cell for selectively storing a respective one of a plurality of bits comprising a first operand; and gating logic for selectively coupling a first line to a second line only if a respective one of the bits comprising a second operand does not match the bit stored in the respective memory cell; and control logic, generally responsive to a mask signal, for selectively preventing a predetermined subset of the CAM cells from coupling the first line to the second line. In accordance with the present invention, the subset of the CAM cells is arranged so that the gating logic thereof selectively couples a first portion of the first line to the second line and the balance of the CAM cells is arranged so that the gating logic thereof selectively couples a second portion of the first line to the second line. In addition, the control logic comprises a coupler, responsive to the mask signal and interposed in the first line between the first and second portions thereof, for decoupling the first portion from the second portion in response to the mask signal. In the preferred form, the mask signal comprises the bit stored in one of the CAM cells.

DETAILED DESCRIPTION OF THE INVENTION

Figure 1:
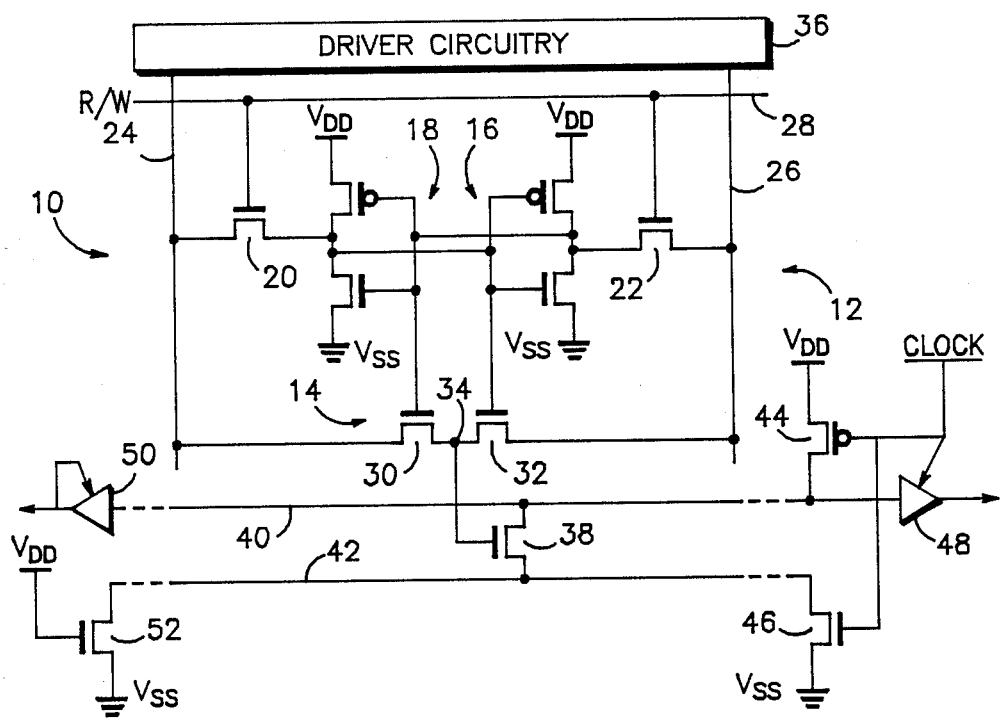
FIG. 1 is a schematic diagram of a content addressable memory (CAM) cell suitable for use with the present invention.

Shown in FIG. 1 is a content addressable memory (CAM) cell 10 comprised of a static read/write memory (RWM) cell 12 and an EXCLUSIVE OR (XOR) gate 14. RWM cell 12 is comprised of a pair of cross-coupled inverters 16-18 having respective inputs and outputs, and a pair of coupling transistors 20-22 which couple the inputs of the inverters 16-18 to respective complementary input (IN-IN*) lines 24-26 in response to a read/write (R/W) signal on line 28. XOR gate 14 is comprised of a pair of transistors 30-32, each of which is coupled in series between a respective one of the input lines 24-26 and an output node 34 with the gate thereof coupled to the output of an appropriate one of the inverters 16-18. In the preferred form shown in FIG. 1, transistors 30-32 are N-channel devices and thus have the gates thereof coupled to the outputs of the complementary inverters 16-18, respectively. However, transistors 30-32 may be P-channel devices if desired, and, if so, the gates thereof would then be coupled to the outputs of the corresponding inverters 18-16, respectively.

During a write operation, RWM cell 12 operates as a conventional static memory to retain the logic state of an operand bit provided by suitable driver circuitry 36 as complementary logic states on the input lines 24-26 while the R/W signal is active. Thus, if the operand bit is a logic ONE, a high on the R/W line 28 will enable coupler 20/22 to couple the high/low on IN/IN* line 24/26 to the input of inverter 16/18, respectively. Due to the cross-coupled outputs, the output of inverter 16/18 will maintain the low/high on the input of inverter 18/16, respectively. Thus, after R/W line 28 goes low, the operand bit stored in the RWM cell 12 will be a logic ONE. On the other hand, if the operand bit is a logic ZERO, the low/high on input lines 24/26 will result in the output of inverter 16/18 being high/low, respectively, and, after R/W goes low, the operand bit stored in the RWM cell 12 will be a logic ZERO.

During a compare operation, XOR gate 14 operates to provide a high on node 34 only if the logic state of an operand bit presented on the input lines 24-26 differs from the logic state of the operand bit stored in the RWM cell 12. Thus, for example, if the operand bit stored in the RWM cell 12 and the operand bit on the input lines 24–26 are both logic ONE, the high on the output of inverter 18 will turn on transistor 32 and couple the node 34 to the low on IN* line 26. Similarly, if operand bit stored in the RWM cell 12 and the operand bit on the input lines 24–26 are both logic ZERO, the high on the output of inverter 16 will turn on transistor 30 and couple the node 34 to the low on IN line 24. Thus, if the input operand bit matches the stored operand bit, the output of the XOR 14 will be a low. On the other hand, if the operand bit stored in the RWM cell 12 is a logic ONE and the operand bit on the input lines 24–26 is a logic ZERO, the high on the output of inverter 18 will turn on transistor 32 and couple the node 34 to the high which is now on IN* line 26. Similarly, if the operand bit stored in the RWM cell 12 is a logic ZERO and the operand bit on the input lines 24–26 is a logic ONE, the high on the output of inverter 16 will turn on transistor 30 and couple the node 34 to the high which is now on IN line 24. Thus, if the input operand bit does not match the stored operand bit, the output of the XOR 14 will be a high.

Although in some applications, the output of the XOR 14 on output node 34 may be utilized directly, the preferred form includes a buffer transistor 38 coupled between a sense line 40 and a ground line 42 with the gate thereof coupled to the output node 34. In this form, the sense line 40 will be coupled to the ground line 42 by the transistor 38 only if the output of the XOR 14 is a high, indicating that the input operand bit does not match the stored operand bit. In addition to reducing the drive requirements of the driver circuitry 36, the use of transistor 38 to buffer the output of XOR 14 allows different sensing schemes to be used.

For example, in some applications, a conventional precharge-discharge virtual ground mechanism may be adequate to sense the outputs of a set of the CAM cells 12 which are coupled in parallel to form an individually addressable word. In such an embodiment, a transistor 44 might be used to precharge the sense line 40 during one phase of a CLOCK signal, while the ground line 42 is isolated from ground by a transistor 46. Simultaneously, the driver circuitry 36 may be enabled so that each CAM cell 10 can be comparing a respective input operand bit to the operand bit stored therein. If there is a match in a particular CAM cell 12, the output of that cell's XOR 14 will be low and transistor 38 will be off; otherwise, the output of that XOR 14 will be high and transistor 38 will be on. During the next phase of the CLOCK signal, transistor 44 will be off and transistor 46 will be on. If the transistor 38 of every CAM cell 10 is off, indicting a match of all input operand bits to all stored operand bits, sense line 40 will remain precharged and the output of a clocked buffer 48 will be high. However, if the transistor 38 of even one of the CAM cells 12 is on, indicating a mismatch in the corresponding bit position, sense line 40 will be discharged and the output of the buffer 48 will be low.

In the preferred embodiment, however, a self-biased sense amplifier 50 is employed to continuously sense the state of the sense line 40. In order to reduce the dynamic operating range of the sense amplifier 50, a current limiting transistor 52 is used to limit the rate of discharge of the sense line 40 via the ground line 42. In addition to reducing power dissipation, the use of current limiting also allows the sense amplifier 50 to operate significantly faster and more reliably over process.

Figure 2:
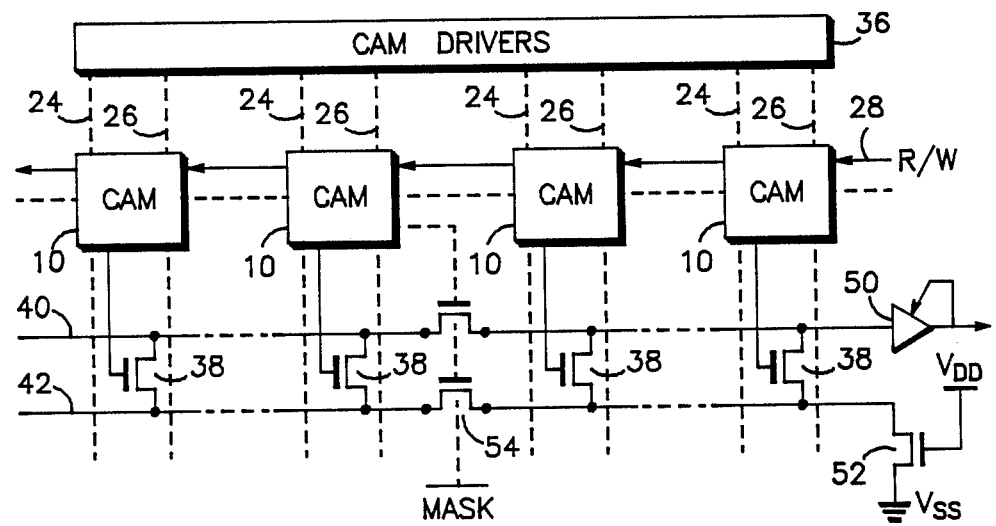
FIG. 2 is a block diagram illustrating a content addressable memory comprising a plurality of the CAM cells of FIG. 1, wherein a field of the CAM cells are selectively masked by one of the CAM cells.

As shown in FIG. 2, a CAM array 54 can be easily formed by connecting a plurality of the CAM cells 10 in parallel to form each of a plurality of individually addressable "words". In this form, the CAM cells 10 in corresponding bit positions of all words can share the same pair of input lines 24–26. Similarly, all of the CAM cells 10 in a particular word can share the same R/W line 28, sense line 40 and ground line 42. This form is particularly advantageous if certain subsets or fields of the bits of each word are to be selectively masked during the match operation in response to a mask signal. Since all of the CAM cells 10 of a single word share the same sense line 40 and ground line 42, the CAM cells 10 which are to store this maskable field can be arranged so that the output transistors 38 thereof are all coupled to the same severable portions of the sense line 40 and ground line 42, while the balance of the CAM cells 10 are arranged so that the output transistors 38 thereof are all coupled to the main portions of lines 40-42. By interposing a single coupler 54 in either the sense line 40 or the ground line 42 (or both) between the two groups of CAM cells 10, as shown in FIG. 2, the entire field can be simultaneously masked in response to the mask signal. In the preferred form, the coupler 54 is interposed in the ground line 42 rather than the sense line 40. If masking on an word-by-word basis is desired, the mask signal may even comprise the bit stored in one of the CAM cells 10. In such an embodiment, it is preferable that that CAM cell 10 be arranged so as to be adjacent to the coupler 54 to faciltate layout.

We claim:

1. In a content addressable memory (CAM) comprising:
   a plurality of CAM cells, each of which comprises:
      a memory cell for selectively storing a respective one of a plularity of bits comprising a first operand;
      comparing means for selectively comparing a respective one of the bits comprising a second operand with the bit stored in the respective memory cell; and
      gating means for selectively coupling a first line to a second line only if said respective one of the bits comprising said second operand does not match the bit stored in the respective memory cell; and
   control means, responsive to a mask signal, for selectively preventing a predetermined subset of said CAM cells from coupling said first line to said second line;
the improvement wherein said subset of said CAM cells is arranged so that the gating means thereof selectively couple a first portion of said first line to said second line and the balance of said CAM cells is arranged so that the gating means thereof selectively couple a second portion of said first line to said second line, and wherein said control means comprises coupling means, responsive to said mask signal and interposed in said first line between said first and second portion thereof, for decoupling said first portion from said second portion in response to said mask signal.

2. The CAM of claim 1 wherein said mask signal comprises the bit stored in a predetermined one of said balance of said CAM cells.

3. The CAM of claim 2 wherein said first line comprises a sense line.

4. The CAM of claim 2 wherein said first line comprises a ground line.

5. The CAM of claim 1 wherein said first line comprises a sense line.

6. The CAM of claim 1 wherein said first line comprises a ground line.

7. In a content addressable memory (CAM) comprising:
 a plurality of CAM cells, each of which comprises:
  a memory cell for selectively storing a respective one of a plurality of bits comprising a first operand;
  comparing meeans for selectively comparing a respective one of the bits comprising a second operand with the bit stored in the respective memory cell; and
  gating means for selectively coupling a first line to a second line only if said respective one of the bits comprising said second operand does not match the bit stored in the respective memory cell; and
 control means, responsive to a mask signal, for selectively preventing a predetermined subset of said CAM cells from coupling said first line to said second line;
a method comprising the steps of:
 arranging said subset of said CAM cells so that the gating means thereof selectively couple a first portion of said frist line to said second line and the balance of said CAM cells so that the gating means thereof selectively couple a second portion of said first line to said second line; and
 selectively decoupling said first portion from said second portion in response to said mask signal.

* * * * *